(12) United States Patent
Vogtmeier et al.

(10) Patent No.: US 8,633,572 B2
(45) Date of Patent: Jan. 21, 2014

(54) LOW OHMIC THROUGH SUBSTRATE INTERCONNECTION FOR SEMICONDUCTOR CARRIERS

(75) Inventors: Gereon Vogtmeier, Aachen (DE); Roger Steadman, Aachen (DE); Ralf Dorscheid, Kerkrade (NL); Jeroen Jonkers, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 1156 days.

(21) Appl. No.: 12/293,101

(22) PCT Filed: Mar. 16, 2007

(86) PCT No.: PCT/IB2007/050914
§ 371 (c)(1),
(2), (4) Date: Sep. 16, 2008

(87) PCT Pub. No.: WO2007/110799
PCT Pub. Date: Oct. 4, 2007

(65) Prior Publication Data
US 2009/0079021 A1    Mar. 26, 2009

(30) Foreign Application Priority Data
Mar. 27, 2006 (EP) .................... 06111756

(51) Int. Cl.
*H01L 29/40* (2006.01)
(52) U.S. Cl.
USPC .................... 257/621; 257/E21.597; 438/667
(58) Field of Classification Search
USPC ............. 438/667; 257/E21.597, 621
See application file for complete search history.

(56) References Cited

U.S. PATENT DOCUMENTS

| 3,962,052 | A | 6/1976 | Abbas et al. |
| 6,365,513 | B1 | 4/2002 | Furukawa et al. |
| 6,475,821 | B2 * | 11/2002 | Honda .................. 257/E21.597 |

(Continued)

FOREIGN PATENT DOCUMENTS

| EP | 1306901 A2 | 5/2003 |
| EP | 1465246 A2 | 10/2004 |

(Continued)

*Primary Examiner* — Stephen W Smoot
*Assistant Examiner* — Sun M Kim

(57) ABSTRACT

It is described a low ohmic Through Wafer Interconnection (TWI) for electronic chips formed on a semiconductor substrate (600). The TWI comprises a first connection extending between a front surface and a back surface of the substrate (600). The first connection (610) comprises a through hole filled with a low ohmic material having a specific resistivity lower than poly silicon. The TWI further comprises a second connection (615) also extending between the front surface and the back surface. The second connection (615) is spatially separated from the first connection (610) by at least a portion of the semiconductor substrate (600). The front surface is provided with a integrated circuit arrangement (620) wherein the first connection (610) is electrically coupled to at least one node of the integrated circuit arrangement (620) without penetrating the integrated circuit arrangement (620). During processing the TWI the through hole may be filled first with a non-metallic material, e.g. poly silicon. After forming integrated components (620) on top of the front surface the substrate (600) may be thinned and the non-metallic material may be substituted with the low ohmic material, which is in particular a metallic material.

22 Claims, 3 Drawing Sheets

(56) References Cited

U.S. PATENT DOCUMENTS

| | | | |
|---|---|---|---|
| 6,756,304 B1 | 6/2004 | Robert | |
| 6,787,916 B2 * | 9/2004 | Halahan | 257/777 |
| 6,897,125 B2 * | 5/2005 | Morrow et al. | 257/E21.597 |
| 7,488,680 B2 * | 2/2009 | Andry et al. | 438/624 |
| 7,786,562 B2 * | 8/2010 | Ozguz et al. | 257/686 |
| 2002/0130380 A1 * | 9/2002 | Theil | 257/453 |
| 2004/0259292 A1 | 12/2004 | Beyne et al. | |
| 2005/0121768 A1 | 6/2005 | Edelstein et al. | |
| 2006/0001174 A1 * | 1/2006 | Matsui | 257/774 |
| 2006/0223301 A1 * | 10/2006 | Vanhaelemeersch et al. | 438/618 |
| 2006/0281292 A1 * | 12/2006 | Trezza et al. | 438/611 |
| 2007/0020926 A1 * | 1/2007 | Kalvesten et al. | 438/667 |
| 2007/0069364 A1 * | 3/2007 | Kawano et al. | 257/698 |

FOREIGN PATENT DOCUMENTS

| | | | |
|---|---|---|---|
| EP | 1519410 A1 | | 3/2005 |
| JP | 01128562 | | 5/1989 |
| JP | 2002289623 | | 10/2002 |
| JP | 2003151978 | | 5/2003 |
| JP | 2005353997 | | 12/2005 |
| WO | WO 2004/012274 | * | 2/2004 |
| WO | WO2007/023416 | * | 3/2007 |

* cited by examiner

LOW OHMIC THROUGH SUBSTRATE INTERCONNECTION FOR SEMICONDUCTOR CARRIERS

The present invention relates generally to carrier structures for building up integrated circuit chips. More particularly, the present invention relates to the field of interconnecting a front surface and an opposing back surface of a semiconductor wafer structure by means of electrically conductive connections.

The development in semiconductor technology has lead to a high component integration density such that nowadays a plurality of electrical components may be formed within one small semiconductor chip. A high density of integrated components often provides the challenge to externally contact at least some of the integrated components. Therefore, Through Wafer Interconnections (TWI) have been developed wherein at least some components of a highly integrated chip may be contacted by means of a connection extending between a front side and an opposing back side of a semiconductor circuit carrier. Thereby, for contacting the components not only conductor paths arranged within the two-dimensional plane of the front surface of the circuit carrier but also connections extending through the circuit carrier substrate may be employed. This has the advantage that for externally contacting the components also the third dimension can be exploited such that highly integrated chips may be built up within a small and a compact configuration.

U.S. Pat. No. 6,365,513 discloses a method for forming a through via within a semiconductor substrate. Thereby, a via hole having a bottom is formed in a substrate and then a conductor layer is formed at least over a sidewall of the via hole. Thereafter, the substrate is thinned by removing a portion of the substrate opposite to another portion of the substrate in which the via hole is formed such that the conductor layer is exposed.

US 2005/0121768 A1 discloses a carrier structure and a method for fabricating a carrier structure with through-vias. Each through-via has a conductive structure with an effective coefficient of thermal expansion which is less than or closely matched to that of the substrate. The conductive structure has an effective elastic modulus value which is less than or closely matches that of the substrate. The conductive structure may include concentric via fill areas having differing materials disposed concentrically therein, a core of the substrate material surrounded by an annular ring of conductive material, a core of a Coefficient Thermal Expansion (CTE) matched non-conductive material surrounded by an annular ring of conductive material, a conductive via having an inner void with low CTE, or a full fill of a conductive composite material such as a metal-ceramic paste which has been sintered or fused.

There may be a need for a further through substrate interconnection for semiconductor carriers providing low ohmic connection between a front surface and a back surface of the semiconductor substrate.

This need may be met by a semiconductor carrier structure, by a detector arrangement and by a method as set forth in the independent claims.

According to a first aspect of the invention the semiconductor carrier structure comprises a semiconductor substrate having a front surface and an opposing back surface, a first connection extending between the front surface and the back surface, wherein the first connection comprises a through hole filled with a low ohmic material having a specific resistivity lower than poly silicon, and a second connection extending between the front surface and the back surface. Thereby, the first connection and the second connection are spatially separated from each other by at least a portion of the semiconductor substrate, the front surface is provided with an integrated circuit arrangement, and the first connection is electrically coupled to at least one node of the integrated circuit arrangement without penetrating the integrated circuit arrangement.

This aspect of the invention is based on the idea that a low ohmic first connection extending between both surfaces of the semiconductor substrate may by realized by filling a low ohmic material into the through hole. The low ohmic material may be any material, which is compatible to the semiconductor manufacturing process e.g. metallic glue and which has a specific resistivity lower than the specific resistivity of poly silicon. Typically, the value for the specific resistivity of poly silicon is in between 0.6 mΩcm and 1.5 mΩcm.

The first connection is formed in such a manner that it abuts or adjoins semiconductor layers, which are assigned to the integrated circuit arrangement.

A low ohmic interconnection between the front surface and the back surface may be used e.g. for Radio Frequency (RF) and high power applications. In both applications it is necessary to provide for a good and reliable grounding and/or to provide for low resistance signal paths for large currents.

It has to be emphasized that according to this aspect of the invention the procedure of filling the through hole with the low ohmic material is carried out after an integrated circuit and in particular a CMOS circuit has been built up on top of the front side of the semiconductor substrate. This means, the procedure of filling the through hole within a so-called back end process is beginning after the formation of the integrated circuit has been finished by means of a so-called front end process. Typically, immediate after finishing the formation of the integrated circuit the integrated circuit is protected by a protection layer. This provides the advantage that any arbitrary low ohmic material may be used. In particular, the low ohmic material may also be a material, which is usually not compatible to the manufacturing process of the integrated circuit.

Preferably, the semiconductor substrate is a silicon substrate, which is widely used in semiconductor physics.

Through holes may be any kind of passage having different shapes and volumes.

The metallic material within the electrically conductive connection may be connected with ground or with any other reference or supply voltage level. Therefore, the described Through Wafer Interconnection (TWI) may allow for a reduction of the length of the conductor path providing reference voltages.

The described semiconductor carrier further provides the advantage that the interconnections may be formed at a very early process stage when a corresponding wafer is not yet singularized into a plurality of individual carriers. Therefore, all or at least some interconnections within a plurality of different circuit carriers may be formed simultaneously within one wafer manufacturing process. This has the advantage that the costs for manufacturing each individual carrier may be reduced significantly.

According to an embodiment of the present invention, the low ohmic material is a metallic material. Preferably, metals like Copper, Tungsten, Aluminum, et cetera are employed.

According to a further embodiment of the invention, the low ohmic material filled in the through hole is obtainable by a substitution of a previous non-metallic filling material. Thereby, conductive or non-conductive materials may be used as the previous non-metallic filling material.

Preferably, the previous non-metallic filling material and the substrate material have similar thermal expansion coefficients. Typically, the non-metallic filling material has a higher specific resistivity than the low ohmic material.

By using a previous or intermediate non-metallic filling material a CMOS circuit arrangement may be formed on top of the front surface at a process stage, wherein the low ohmic material has not yet been inserted into the substrate. This may allow for a usual CMOS process without maintaining special process parameters, which would be necessary for a structure having incorporated a low ohmic material in a semiconductor substrate. Such special conditions might for instance be necessary because of completely different thermal expansion coefficients of the low ohmic material and the silicon substrate.

According to a further embodiment of the invention, the previous non-metallic filling material is poly silicon. Poly silicon typically has similar thermal and mechanical properties compared to a silicon substrate. Electronic circuit arrangements may be formed on top of the front surface by means of usual and well-known semiconductor manufacturing processes without taking care of special properties of the substrate having poly silicon inserted in the silicon substrate.

It has to be pointed out that it is also possible not to replace all poly silicon interconnections but to replace only some of the poly silicon inserts by the low ohmic material. This may lead to a structure with both at least one conductive connection filled with the low ohmic material and at least one conductive connection filled with poly silicon.

It has to be noted that also only a partial replacement of the poly silicon material within one gap is possible.

According to a further embodiment of the invention, the first connection exhibits the shape of a first gap. This has the advantage that the through hole may be formed easily by means of known techniques for partially removing substrate material using appropriate masks.

In this context the term "gap" also includes a structure wherein a spacing between two elements or within a single material is not empty but filled with a material being different from the material of the two elements or the single material, respectively.

It has to be noted that the gaps may be formed with different shapes. In this respect it is only necessary that each gap provides a continuous opening or passage between the front surface and the back surface. Preferably, the first gap extends perpendicular to the front surface. Different kinds of ablating techniques may be used in order to generate a gap extending substantially perpendicular to the front surface.

In this respect it has to be pointed out that within a semiconductor manufacturing process a gap may be formed by means of various techniques. For instance, starting from a trench or a blind via a gap may be formed by means of a thinning procedure. Thereby, semiconductor material is removed until a passage between the front surface and the back surface is opened.

Preferably, the gap exhibits no taper or a least a very small taper wherein the thickness of the gap becomes only slightly smaller when approaching the back surface. This may be achieved by a Deep Reactive Ion etching process, e.g. an optimized so-called Bosch process. In a Bosch process there is carried out repeatedly a process sequence comprising first an etching procedure and second a passivation procedure.

According to a further embodiment of the invention, the first gap is a first self-contained structure. This has the advantage that the first connection exhibits a mechanically very stable structure. Differences is thermal expansion may be compensated by a close and tight connection between the substrate material and the low ohmic material being filled in the gap.

According to a further embodiment of the invention, the first self-contained structure exhibits the shape of a first cylindrical ring having a predetermined wall thickness. Thereby, a highly symmetric structure may be formed which is very durable from a mechanic point of view.

According to a further embodiment of the invention, the second connection exhibits a second self-contained structure having the shape of a second gap. Also the second gap may be formed by means of known techniques for partially removing substrate material using appropriate masks.

It has to be mentioned that also the second connection may be formed in various different shapes. In this respect the term different shapes can be understood as all possible designs of a through hole, which extends end-to-end between the front surface and the back surface. Preferably, also the second gap extends perpendicular from the front surface.

According to a further embodiment of the invention, the second self-contained structure exhibits the shape of a second cylindrical ring having a predetermined wall thickness. This means, that also the second connection exhibits a highly symmetric structure, which is mechanically very durable.

According to a further embodiment of the invention, the second gap is surrounding the first connection. This has the advantage that the structure comprising both the first and the second connection may be a highly symmetric and mechanically stable arrangement.

It has to be mentioned that the semiconductor carrier might also comprise a third connection wherein a third gap is surrounding the second gap. Of course, also multiple connections comprising four or even more connections are possible, wherein the higher order connections are surrounding the lower order connections.

According to a further embodiment of the invention, the second gap is filled with an electrically insulating material. This has the advantage that the second connecting between the front surface and the back surface provides an effective and reliable insulation between the first connection being electrically conductive and the outer semiconductor substrate surrounding the second gap.

According to a further embodiment of the invention, the lateral walls of the first connection and/or the lateral walls of the second connection comprise an insulating coating. The insulating coating is e.g. $SiO_2$. Common known oxidation techniques and/or passivation techniques for producing such a layer may be applicable.

It has to be noted that in particular when the second gap is surrounding the first connection and when the second gap is filled with an insulating material the insulating properties of the second gap may be significantly improved if the lateral walls of the second gap are provided with an insulating coating. This may allow for an even better insulation between the first connection being electrically conductive and the substrate surrounding the second gap.

According to a further embodiment of the invention, in between the front surface and the integrated circuit arrangement there is formed an insulating layer pierced by the electrically conductive connection. This has the advantage that on top of the insulation layer there may be provided any type of semiconductor circuit arrangements. Thereby, the TWI may provide a low ohmic electrically conductive connection selectively to predetermined locations on the semiconductor carrier structure, which are connectable by a semiconductor circuit arrangement formed on the front surface of the semiconductor substrate.

According to a further embodiment of the invention, the semiconductor carrier structure further comprises a further first connection extending between the front surface and the back surface, wherein the further first connection comprises a further through hole, and a further second connection extending between the front surface and the back surface. Thereby, the further first connection and the further second connection are spatially separated from each other by at least a portion of the semiconductor substrate and the further first connection is electrically coupled to at least one node of the integrated circuit arrangement without penetrating the integrated circuit arrangement.

Also the further first and further second connection may be formed in various ways. In particular these connections may be formed in the same manner as the first and second connection, respectively. Therefore, the embodiments described above relating to the first and to the second connection also relate to the further connections.

According to a further embodiment of the invention, the further through hole is filled with a non-metallic conductive material, in particular with electrically conductive poly silicon. This means, that a semiconductor carrier structure may comprise a combination of low ohmic material interconnections and poly silicon interconnections. This has the advantage that the described semiconductor carrier structure may be used for a variety of different applications wherein some contact elements of an electronic circuit take benefit from the poly silicon interconnections wherein other contact elements of the electronic circuit take benefit from the low ohmic interconnection.

The conductivity of the poly silicon may be adjusted by an appropriate doping of the poly silicon e.g. by boron, arsenic, aluminum, phosphor, et cetera.

According to a further aspect of the invention there is provided a detector arrangement for detecting electromagnetic radiation, in particular for detecting X-rays. The detector arrangement comprises at least one semiconductor carrier structure according to any one of the embodiments described above. Preferably, the detector arrangement is a sensor array, wherein the integrated circuit arrangement represents a detector element.

Preferably, the detector arrangement comprises a plurality of first connections being electrically conductive, each being surrounded by a corresponding second connection being electrically insulating, and a plurality of optical elements being arranged in a two dimensional array, wherein each optical element is coupled with one first connection. This has the advantage that two-dimensional sensors and two-dimensional displays may be manufactured very effectively, whereby the optical elements are each electrically insulated from each other.

Further, the ratio of an optical non-active area may be reduced compared to optical arrays wherein the optical elements are connected by means of conductor paths arranged at the same side of the substrate as the optical elements.

It has to be pointed out that the plurality of electrically conductive connections may also be formed in order to contact electrical elements other than optical elements. The electrically conductive connections extending between the front surface and the back surface represent electric connections arranged in the third dimension. Therefore, it may be possible to arrange the electrical elements within a comparatively small area on the semiconductor carrier. This may be beneficial in particular for so-called stacked components wherein at least one electric component is arranged directly onto another electric component.

Preferably, the optical elements are CMOS optical elements.

According to a further aspect of the invention there is provided a method for fabricating a semiconductor carrier structure comprising a first connection and a second connection extending between a front surface and a back surface of a semiconductor substrate. The method comprises the steps of (a) forming, beginning from the front surface, a first trench and a second trench in the semiconductor substrate, wherein each trench has a predetermined minimum depth and both trenches are spatially separated from each other by at least a portion of the semiconductor substrate, (b) filling the first trench and the second trench with a non-metallic filling material, (c) forming an integrated circuit arrangement at the front surface and (d) thinning the semiconductor substrate starting from the back surface in such a manner that the backside front ends of the filled trenches are uncovered and the first trench represents the first connection and the second trench represents the second connection, respectively. The method further comprises the steps of (e) removing the non-metallic filling material within the first trench at least partially, and (f) filling the first trench with a low ohmic material having a specific resistivity lower than poly silicon in such a manner that the first connection is electrically coupled to at least one node of the integrated circuit arrangement without penetrating the integrated circuit arrangement.

This aspect of the invention is based on the idea that a low ohmic material having a specific resistivity lower than poly silicon may be used in order to provide low ohmic interconnections. Since the low ohmic material and any other material filled in the second trench are separated from each other, different thermal expansion properties between both materials may not be harmful because both materials are embedded within the semiconductor substrate representing a more or less rigid structure. Therefore, the substrate should be able to compensate for such differences with respect to the thermal behavior.

After thinning the filled trenches the filled trenches may be better denoted as gaps. The gaps are extending between the front surface and the back surface. The removing of the non-metallic filling material and the filling of the first trench is carried out from the back side of the semiconductor substrate. Therefore, the substitution of the non-metallic filling material with the low ohmic material is carried out in a process step being assigned to the so-called back end processing.

The low ohmic material may be any material, which is compatible to the semiconductor manufacturing process e.g. metallic glue. However, it is not necessary that the low ohmic material is compatible to the process forming the integrated circuit arrangement at the front surface. Therefore, the integrated circuit arrangement may comprise CMOS components, the formation of which is typically very sensitive to a variety of different low ohmic materials. In other words, within a corresponding CMOS process no special care has to be taken with respect to the low ohmic material, which is filled into the first trench after formation of the CMOS circuit. Therefore, the optimal process parameters for the CMOS process may be used in order to build up the CMOS circuit at the front surface.

Preferably, the lowest metal layer of a CMOS circuit arrangement will be contacted to the first connection being electrically conductive.

According to an embodiment of the present invention, the non-metallic filling material is electrically conductive poly silicon. As has already been pointed out above, poly silicon typically has similar thermal and mechanical properties compared to a silicon substrate. Therefore, electronic circuit arrangements may be formed on top of the front surface by means of usual and well-known semiconductor manufacturing processes without taking care of special properties of the substrate having poly silicon inserted in the silicon substrate.

According to a further embodiment of the present invention, the low ohmic material is a metallic material. Preferable metals are e.g. Copper, Tungsten, Aluminum, et cetera.

According to a further embodiment of the invention, before filling the first trench with the low ohmic material, the method further comprises the step of providing at least one inner wall of the first trench with an insulating coating. Preferably, this step is carried out after the step of removing the non-metallic filling material from the first trench. The insulating coating may be for instance a passivation layer of an oxide layer, e.g. $SiO_2$.

According to a further embodiment of the invention, the method further comprises the steps of removing the non-metallic filling material from the second trench at least partially and filling the second trench with a filling material. These steps are also carried out after the formation of the integrated circuit arrangement such that the filling material might be a material being non-compatible with a process wherein the integrated circuit arrangement and in particular a CMOS circuit is formed.

The step of removing the non-metallic filling material is typically carried out by means of an etching process employing a special mask.

According to a further embodiment of the invention, the filling material is an electrically insulating material. This is in particular advantageous if the second trench is surrounding the first trench. This may yield to an improved mechanical stability of the semiconductor substrate being provided with the first and the second connection. Furthermore, this may yield to a further improved electrical insulation between the first connection being electrically conductive and the semiconductor material surrounding the second trench.

According to a further embodiment of the invention, before filling the second trench with the filling material, the method further comprises the step of providing at least one inner wall of the second trench with an insulating coating. This has the advantage that an insulation between the second connection and the semiconductor substrate may be formed in an easy and in an effective way. The insulating coating may be for instance a passivation layer of an oxide layer.

According to a further embodiment of the invention, after filling the first trench with the non-metallic filling material and before removing the non-metallic filling material from the first trench at least partially, the method further comprises the step of polishing at least the front surface of the semiconductor substrate.

Thereby, the outer measurements of the modified semiconductor substrate may correspond exactly to the outer measurements of the starting semiconductor substrate.

It has to be noted that the step of polishing may be carried out with a whole wafer such that simultaneously a plurality of connections filled with the intermediate non-metallic filling material may be flattened. This has the advantage that the costs for manufacturing each individual carrier may be reduced significantly because the wafer may be singularized into a plurality of semiconductor circuit carriers at a later process stage.

The polishing procedure may ensure that after filling and before emptying the first trench the semiconductor substrate has the same shape and the same outer measurements compared to the original semiconductor substrate. Depending on the mechanical properties of the non-metallic filling material the modified semiconductor substrate may be processed in the same way as the original semiconductor substrate. Therefore, usual and known semiconductor techniques may be employed in order to build electronic circuits on the front surface.

According to a further embodiment of the invention, the method further comprises the step of providing an electric contact to the first connection at the back surface of the semiconductor substrate. Such an electric contact may preferably be formed by means of solder balls formed at the back surface of the semiconductor substrate. The procedure of forming solder balls is called a bumping process.

According to a further embodiment of the invention, the method further comprises the step of forming a plurality of first connections and a plurality of second connections each extending between the front surface and the back surface of the semiconductor substrate. Preferably, the first connections are electrically conductive connections and the second connections are electrically insulating connections and the each first connection is being surrounded by a corresponding second connection. This has the advantage that the described method can be applied to a whole wafer such that a plurality electrically conductive interconnections is generated on a single piece of wafer, which are electrically insulated from each other. After collectively forming all interconnections the wafer can be singularized in order to fabricate a plurality of individual semiconductor carrier structures. Thereby, the efficiency of the carrier structure manufacturing process is improved and, as a consequence, the actual cost for manufacturing each semiconductor carrier structure is reduced significantly.

According to a further embodiment of the invention the method further comprises the step of forming a plurality of optical elements at the front surface, the optical elements being arranged within a two dimensional array wherein each optical element is electrically coupled with at least one first connection being electrically conductive.

This has the advantage that two-dimensional sensors and two-dimensional displays may be manufactured very effectively. Compared to known optical arrays wherein the optical elements are connected by means of conductor paths arranged at the same side of the substrate as the optical elements, the share or the portion of optical non-active area with respect to the total area of the available front surface may be reduced significantly. This may allow for the manufacturing of very efficient optical sensor arrays and optical displays.

According to a further embodiment of the invention, the optical elements are optical sender elements or optical detector elements. In particular, the optical elements are CMOS detector elements being sensitive for electromagnetic radiation. Thereby, electromagnetic radiation may be e.g. X-radiation, UV-radiation, visible radiation or infrared radiation. With respect to the detection of X-radiation it is possible to detect X-ray directly or by means of indirect conversion with a scintillation medium.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one subject matter also any combination between features relating to different subject matters, in particular between features of the apparatus type claims and features of the method type claims is considered to be disclosed with this application.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

The illustration in the drawing is schematically. It is noted that in different drawings, similar or identical elements are provided with the same reference signs or with reference signs, which are different from the corresponding reference signs only within the first digit.

Figure 1:
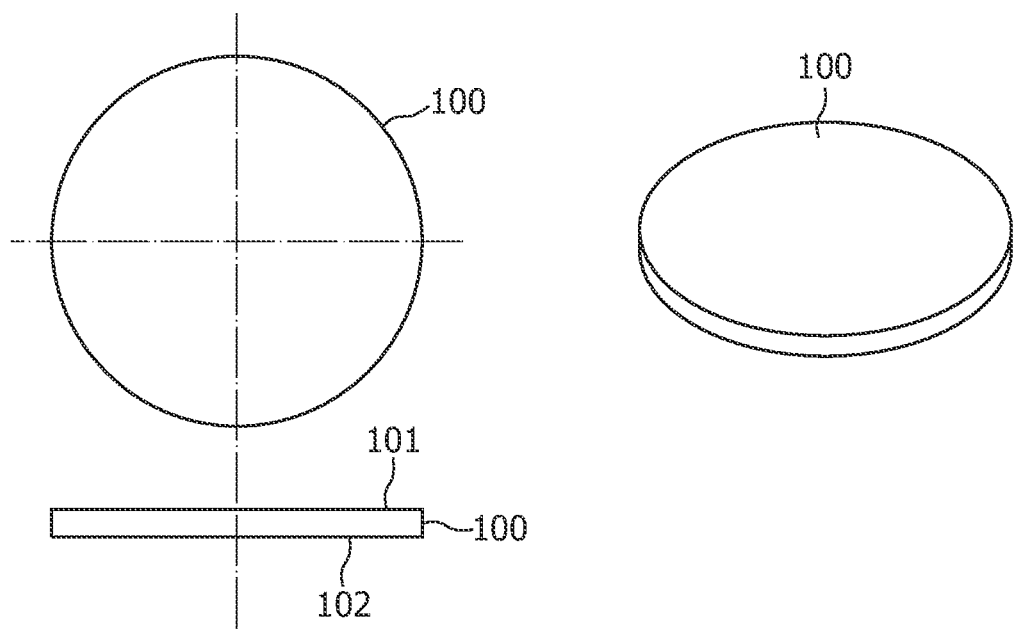
FIG. 1 shows three different perspectives of a bare silicon wafer substrate.

FIG. 1 shows three different perspectives of a raw CMOS wafer 100 made from silicon. The wafer 100 has a front surface 101 and a back surface 102. The wafer 100 is the basis material for semiconductor carrier structures according to embodiments of the described invention. The wafer 100 may be processed as a whole such that a plurality of electronic circuit arrangements may be formed simultaneously on the front surface 101 of the wafer 100.

Typically the wafer 100 has a thickness of approximately 600 μm to 675 μm. This allows for an easy handling of the wafer 100 during a plurality of processing steps without having a high risk of a mechanical breakage. The wafer 100 has typically a diameter of 6" (150 mm), 8" (200 mm) or 12" (300 mm).

Figure 2:
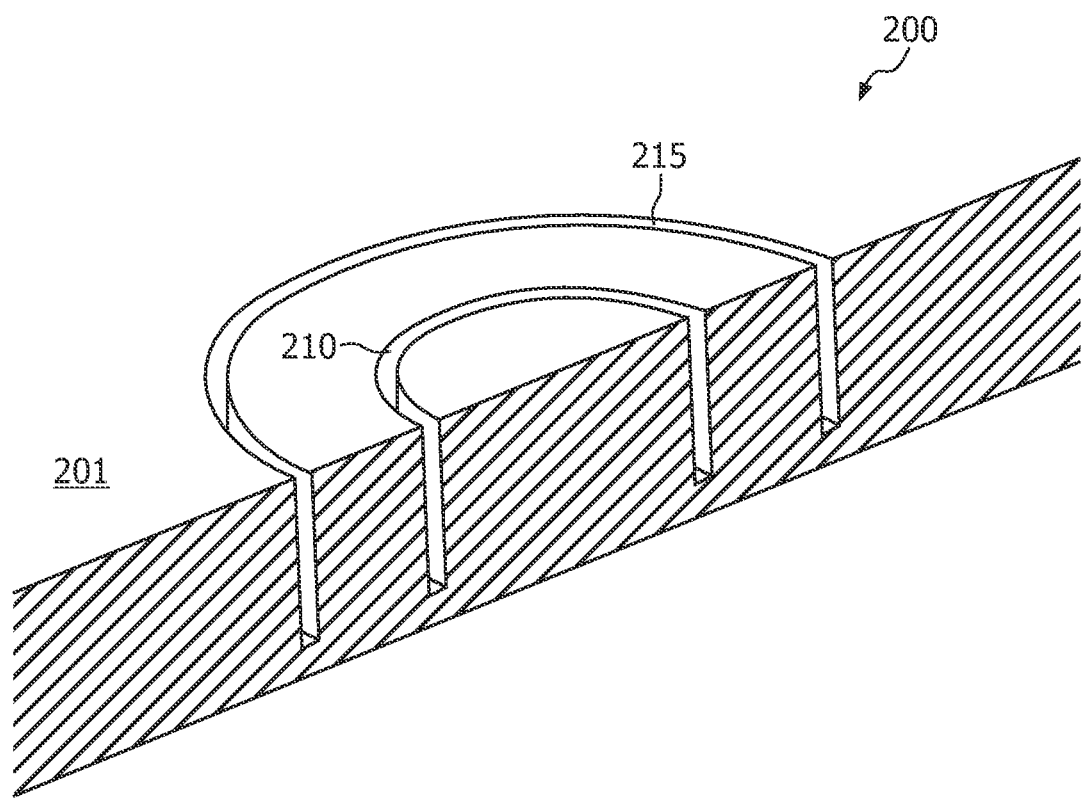
FIG. 2 shows a perspective sectional view of a semiconductor substrate being provided with two circular trenches arranged concentrically with respect to each other.

FIG. 2 shows a perspective sectional view of a semiconductor substrate 200 having a front surface 201. Within the front surface 201 there is provided a first trench 210 and a second trench 215. The two trenches 210 and 215 have a circular shape. Further, the two trenches 210 and 215 are arranged concentrically with respect to each other.

The two trenches 210 and 215 have a depth of approximately 280 μm. Preferably, the trenches 210 and 215 are etched by means of a so-called Bosch process. In a Bosch process there is carried out repeatedly a process sequence comprising first an etching procedure and second a passivation procedure.

The etching process may be a so-called Deep Reactive Ion etching procedure wherein reactive ions are used in order to ablate the silicon. The passivation procedure typically comprises an oxidation procedure. Since the trenches 210 and 215 have a strong influence on the mechanical stability of the semiconductor substrate 200 the depth is chosen such that the mechanical stability requirements for all process steps of the semiconductor substrate 200 are fulfilled.

It has to be pointed out that by means of the above-mentioned Bosch process trenches with a very high aspect ratio may be formed. In this context the aspect ratio is the ratio between the depth of the trenches 210 and 215 and the width of the trenches 210 and 215, respectively. Of course, also different depth values are possible.

Figure 3:
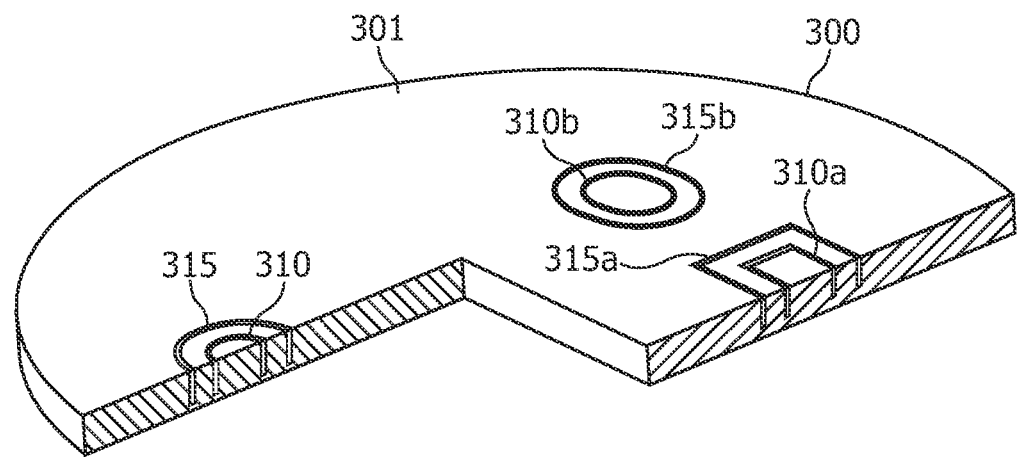
FIG. 3 shows a perspective sectional view of a semiconductor substrate being provided with three different formed pairs of trenches.

FIG. 3 shows a perspective sectional view of a semiconductor substrate 300 having a front surface 301. Within the front surface 301 there is provided a first trench 310 and a second trench 315. The two trenches 310 and 315 have a circular shape. Further, the two trenches 310 and 315 are arranged concentrically with respect to each other.

Within the front surface 301 there is provided further a first variant of a first trench 310a and a first variant of a second trench 315a. The trenches 310a and 315a have both a rectangular shape. The trench 315a, which is a self-contained structure, completely surrounds the trench 310a.

Furthermore, within the front surface 301 there is provided a second variant of a first trench 310b and a second variant of a second trench 315b. The trenches 310b and 315b have both an oval shape. The second trench 315b, which is a self-contained structure, completely surrounds the first trench 310b.

At this point it is emphasized that the trenches may also be formed in different shapes. For instance, the first trench being surrounded by the second trench may not be a self-contained structure. In particular, the first trench may be formed as a single blind via or a trench comprising a rounded spiral or an angularly spiral structure. Anyway, it is not necessary that the first trench is a self-contained structure. The first trench may represent an open structure of an arbitrary shape.

Figure 4:
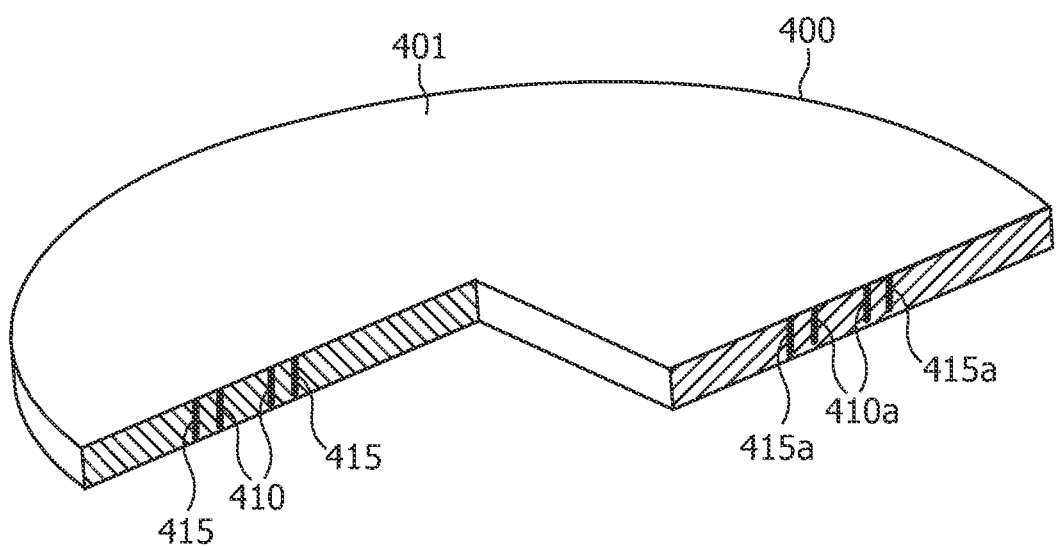
FIG. 4 shows the semiconductor substrate depicted in FIG. 3, wherein the trenches have been filled with poly silicon.

FIG. 4 shows the semiconductor substrate 300 depicted in FIG. 3, which is now denoted with the reference sign 400. As can be seen from FIG. 4, the trenches have been filled up.

The first trenches 410, 410a and 410b (not shown) and the second trenches 415, 415a and 415b (not shown) have all been filled with a conductive material having similar electric and mechanic properties as the silicon material used for the substrate 400. Preferably, the conductive material is poly silicon, which is doped appropriately in order to improve the conductivity.

In order to improve the insulation between the first trenches 410, 410a and surrounding semiconductor material the lateral side walls of the first trenches 410, 410a may be provided with an insulating coating. The same holds for the lateral side walls of the second trenches 415, 415a. In both cases the insulating coating may be any passivation layer or an oxide layer.

After the filling procedure the front surface 401 of the semiconductor substrate 400 is polished such that the front surface 401 represents a smooth and even surface. As a consequence, the upsides of the filled trenches are not visible any more.

The semiconductor substrate 400 shown in FIG. 4 represents a substrate onto which a CMOS circuit arrangement may be formed by means of known CMOS processes. Of course, also other types of circuit arrangements may be formed on the polished front surface 401 of the wafer substrate 400.

Figure 5:
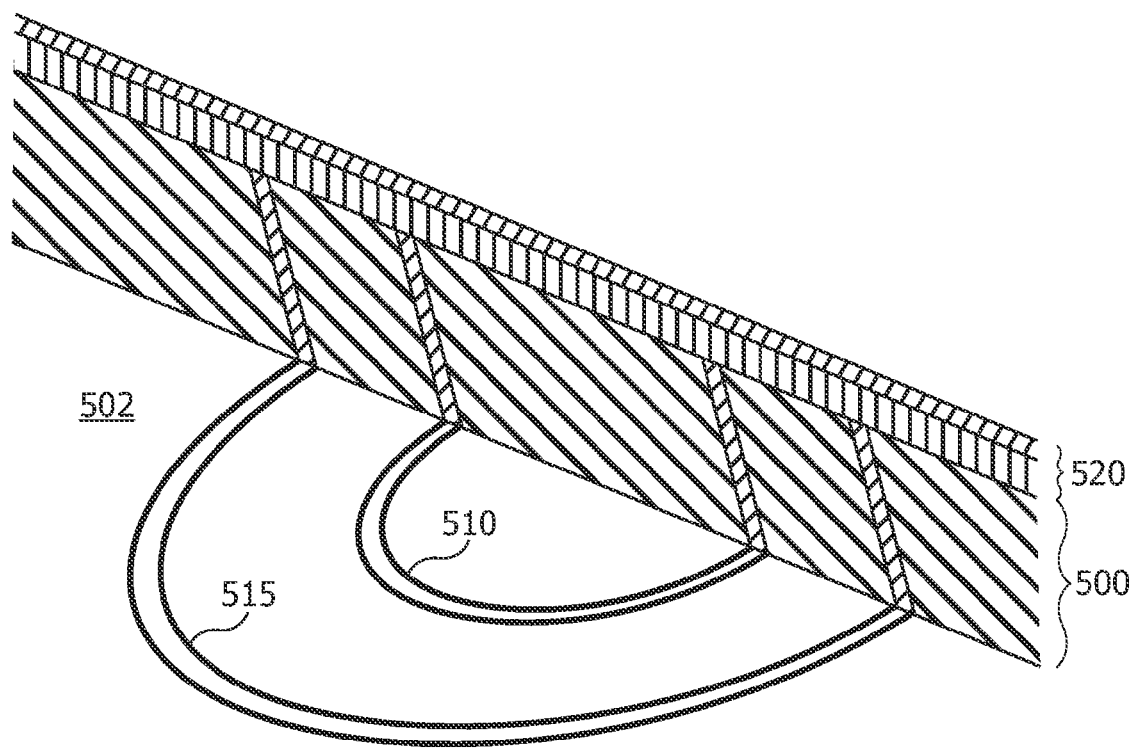
FIG. 5 shows a perspective sectional view of the bottom and a side surface of a semiconductor substrate being provided with two filled circular gaps and with a CMOS layer comprising a fully formed CMOS circuit arrangement.

FIG. 5 shows a perspective sectional view of the back surface 502 and of a side surface of a semiconductor substrate 500. Compared to the semiconductor substrate 400 shown in FIG. 4 a first modification A and a second modification B have been carried out.

Modification A: The front surface has been provided with a CMOS layer 520, which is depicted only schematically. The CMOS layer comprises a full CMOS semiconductor assembly 520 being built up with a plurality of semiconductor components (not shown).

Modification B: The semiconductor substrate 500 has been thinned starting from the back surface such that the backside front ends of the filled trenches 510 and 515 are uncovered or opened. This means that the trenches have been converted into gaps 510 and 515, respectively.

The thinning procedure might be carried out e.g. by means of Chemical Mechanical Polishing or by Wet Chemical Etching. At the end of the thinning process the final thickness of the semiconductor substrate 500 is e.g. 280 μm.

After the thinning procedure of the semiconductor substrate 500 has been finished there are carried out two further process steps, which cannot be derived explicitly from the drawing. Within a first process step the poly silicon is removed by means of an etching process. Thereby, an appropriate mask may be used in order to remove the poly silicon in all gaps or in order to remove the poly silicon only in a selection of all gaps.

According to the embodiment described herewith, the mask is designed in such a manner that the poly silicon is removed only from the trench 510.

After the step of removing the poly silicon the opened gap 510 is filled with a low ohmic material. The opened gap 510 may be filled with an electrically conductive glue or with a metallic material. As a metallic material copper, tungsten, metallic powder e.g. in a baked or sintered configuration may be used.

The step of removing the poly silicon and the step of filling the opened gap with a metallic material is preferably carried out from the back surface 502 of the semiconductor substrate 500. This has the advantage that it may be easily prevented that the CMOS layer 520 comes into touch with the metallic material.

Figure 6:
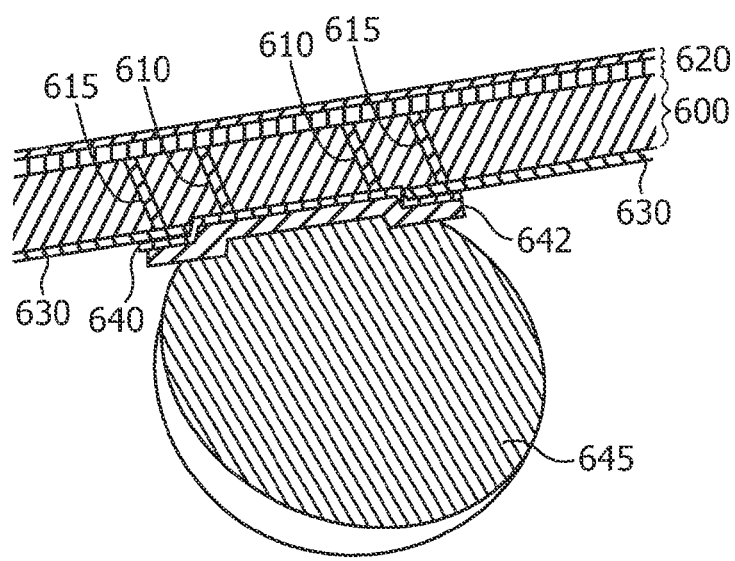
FIG. 6 shows a perspective sectional view of a semiconductor substrate being provided with a CMOS layer at the front surface and a solder ball at the back surface.

FIG. 6 shows a perspective sectional view of a semiconductor substrate 600 being provided with a CMOS layer 620 at the front surface and a solder ball 645 at the back surface. The shown assembly represents a portion of an electronic chip, which comprises a plurality of solder balls 645. Such a chip is called a Ball Grid Array (BGA).

Within the semiconductor substrate 600 there is provided a first gap 610, which is filled with a metallic material having a low ohmic resistivity. Within the semiconductor substrate 600 there is further provided a second gap 615, which is filled with poly silicon. The two gaps 610 and 615 have a circular form and are arranged concentrically with respect to each other.

In order to protect the chip there is provided a passivation layer on the back surface of the semiconductor substrate 600.

In order to provide a reliable contact between the solder ball 645 and the low ohmic interconnection 610 there is provided a first contact element 640 and a second contact element 642 in between the low ohmic interconnection 610 and the solder ball 645. The first contact element 640 may be made from AlSiTi. The second contact element 642 may be made from NiAu.

Depending on the design of the Through Wafer Interconnection (TWI) and in particular the design of the trenches or gaps, respectively, it is possible to optimize the electrical specification according to the requirements with respect to capacitance, insulation and resistance of the TWI. The properties can be calculated and simulated in order to predict the final characteristics of the semiconductor carrier structure. Thereby, an optimization for analog or digital signals may be achieved. Also the insulation properties can be tuned in order to avoid leakage currents. With additional back surface processing (back side processing) of the wafer there are some more options for rerouting of the signals in order to achieve an optimal placement of the solder balls, in order to form double contacts to increase the current load capabilities and/or in order to choose a design with redundant signals.

As the whole TWI process, which comprises etching, filling, CMOS processing, thinning, substituting a fill material by another low ohmic fill material and the bumping, may be carried out with a complete wafer, the costs for an individual chip are much lower compared to providing interconnections at individual chips. The described process has the advantage that the complete process is CMOS fabrication compatible and requires only standard equipment.

The placement of the chip on substrates or other materials is similar to a BGA mounting process. The final thickness of the chip could be chosen at the end of the TWI producing process. This allows for quite some flexibility on the mechanical properties, which is also an advantage for some applications of the described semiconductor substrate.

It should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

In order to recapitulate the above described embodiments of the present invention one can state:

It is described a low ohmic Through Wafer Interconnection (TWI) for electronic chips formed on a semiconductor substrate 600. The TWI comprises a first connection 610 extending between a front surface and a back surface of the substrate 600. The first connection 610 comprises a through hole filled with a low ohmic material having a specific resistivity lower than poly silicon. The TWI further comprises a second connection 615 also extending between the front surface and the back surface. The second connection 615 is spatially separated from the first connection 610 by at least a portion of the semiconductor substrate 600. The front surface is provided with an integrated circuit arrangement 620 wherein the first connection 610 is electrically coupled to at least one node of the integrated circuit arrangement 620 without penetrating the integrated circuit arrangement 620. During processing the TWI the through hole may be filled first with a non-metallic material, e.g. poly silicon. After forming integrated components 620 on top of the front surface the substrate 600 may be thinned and the non-metallic material may be substituted with the low ohmic material, which is in particular a metallic material.

LIST OF REFERENCE SIGNS

100 raw CMOS wafer (silicon)
101 front surface
102 back surface
200 semiconductor substrate
201 front surface
210 first trench
215 second trench
300 semiconductor substrate
301 front surface
310 first trench
315 second trench
310*a* first trench (first variant)
315*a* second trench (first variant)
310*b* first trench (second variant)
315*b* second trench (second variant)
400 semiconductor substrate
401 front surface (polished)
410 first trench (filled with poly silicon)
415 second trench (filled with poly silicon)
410*a* first trench (filled with poly silicon)
415*a* second trench (filled with poly silicon)

500 semiconductor substrate
502 back surface
510 first trench/gap (filled with metallic material)
515 second trench/gap (filled with poly silicon)
520 CMOS layer/CMOS semiconductor assembly
600 semiconductor substrate
610 first gap (filled with metallic material)
615 second gap (filled with poly silicon)
620 CMOS layer/CMOS semiconductor assembly
630 passivation layer
640 first contact element/AlSiTi
642 second contact element/NiAu
645 solder ball

The invention claimed is:

1. A semiconductor carrier structure comprising:
a semiconductor substrate having a front surface and an opposing back surface, wherein the front surface is provided with an integrated circuit arrangement;
a first connection extending between the front surface and the back surface, wherein the first connection comprises a through hole filled with a low ohmic material having a specific resistivity lower than poly silicon, surrounds a portion of the semiconductor substrate, and is electrically coupled to at least one node of the integrated circuit arrangement without penetrating the integrated circuit arrangement;
a second connection extending between the front surface and the back surface, wherein the first connection and the second connection are spatially separated from each other by at least a portion of the semiconductor substrate, the second connection is made of doped poly silicon and is a self-contained structure that surrounds the first connection;
a solder ball at the back surface;
a first contact element between the first connection and the solder ball, wherein the first contact element includes AlSiTi; and
a second contract element between the first connection and the solder ball, wherein the second contact element includes NiAu.

2. The semiconductor carrier structure according to claim 1, wherein the low ohmic material is a metallic material.

3. The semiconductor carrier structure according to claim 1, wherein the low ohmic material is a non-metallic filling material.

4. The semiconductor carrier structure according to claim 3, wherein the non-metallic filling material is doped poly silicon that has a specific resistivity lower than poly silicon.

5. The semiconductor carrier structure according to claim 1, wherein the first connection exhibits the shape of a first gap.

6. The semiconductor carrier structure according to claim 5, wherein the first gap is a first self-contained structure.

7. The semiconductor carrier structure according to claim 6, wherein the first self-contained structure exhibits the shape of a first cylindrical ring having a predetermined wall thickness.

8. The semiconductor carrier structure according to claim 1, wherein the second connection exhibits a second self-contained structure having the shape of a second gap 9. The semiconductor carrier structure according to claim 8, wherein the second self-contained structure exhibits the shape of a second cylindrical ring having a predetermined wall thickness.

10. The semiconductor carrier structure according to claim 1, wherein lateral walls of the first connection and/or lateral walls of the second connection comprise an insulating coating.

11. The semiconductor carrier structure according to claim 1, wherein in between the front surface and the integrated circuit arrangement there is formed an insulating layer pierced by the electrically conductive connection.

12. A method for fabricating a semiconductor carrier structure comprising a first connection and a second connection extending between a front surface and a back surface of a semiconductor substrate, the method comprising the steps of:
forming, beginning from the front surface, a first trench and a second trench in the semiconductor substrate, wherein each trench has a predetermined minimum depth and both trenches are spatially separated from each other by at least a portion of the semiconductor substrate, wherein the second trench is a self-contained structure that surrounds the first trench;
filling the first trench and the second trench with a non-metallic filling material;
forming an integrated circuit arrangement at the front surface;
thinning the semiconductor substrate starting from the back surface in such a manner that the backside ends of the filled trenches are uncovered and the first trench represents the first connection and the second trench represents the second connection, respectively;
removing the non-metallic filling material within the first trench at least partially;
filling the first trench with a low ohmic material having a specific resistivity lower than poly silicon in such a manner that the first connection is electrically coupled to at least one node of the integrated circuit arrangement without penetrating the integrated circuit arrangements;
partially removing the non-metallic filling material from the second trench;
filling the second trench with a doped poly silicon;
attaching a first contact element to the filled first trench at the back surface of the semiconductor substrate;
attaching a second contact element to the filled first trench at the back surface of the semiconductor substrate; and
attaching a solder ball to the first contact element and the second contact element, wherein the first contact element and the second contact element are between the filled first trench and the solder ball.

13. The method according to claim 12, wherein the low ohmic material is a metallic material.

14. The method according to claim 12, wherein before filling the first trench with the low ohmic material, the method further comprises the step of providing at least one inner wall of the first trench with an insulating coating.

15. The method according to claim 12, wherein before filling the second trench with the filling material, the method further comprises the step of providing at least one inner wall of the second trench with an insulating coating.

16. The method according to claim 12, wherein after filling the first trench with the non-metallic filling material and before removing the non-metallic filling material from the first trench at least partially, the method further comprises the step of polishing at least the front surface of the semiconductor substrate.

17. The method according to claim 12, further comprising the step of providing an electric contact to the first connection at the back surface of the semiconductor substrate.

18. The method according to claim 12, further comprising the step of forming a plurality of first connections and a plurality of second connections each extending between the front surface and the back surface of the semiconductor substrate.

19. The method according to claim 18, further comprising the step of forming at the front surface a plurality of optical elements being arranged in a two dimensional array wherein each optical element is electrically coupled with at least one first connection.

20. The method according to claim 19, wherein the optical elements are optical sender elements or optical detector elements.

21. The method according to claim 12, wherein the first contact element includes AlSiTi.

22. The method according to claim 12, wherein the second contact element includes NiAu.

\* \* \* \* \*